(12) United States Patent
Yang

(10) Patent No.: US 10,707,166 B2
(45) Date of Patent: Jul. 7, 2020

(54) ADVANCED METAL INTERCONNECTS

(71) Applicant: International Business Machines Corporation, Armonk, NY (US)

(72) Inventor: Chih-Chao Yang, Glenmont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 496 days.

(21) Appl. No.: 15/284,919

(22) Filed: Oct. 4, 2016

(65) Prior Publication Data
US 2018/0096945 A1  Apr. 5, 2018

(51) Int. Cl.
*H01L 23/532* (2006.01)
*H01L 21/768* (2006.01)
*H01L 21/02* (2006.01)

(52) U.S. Cl.
CPC .. *H01L 23/53266* (2013.01); *H01L 21/02304* (2013.01); *H01L 21/02362* (2013.01); *H01L 21/7684* (2013.01); *H01L 21/76829* (2013.01); *H01L 21/76831* (2013.01); *H01L 21/76849* (2013.01); *H01L 21/76852* (2013.01); *H01L 23/53238* (2013.01); *H01L 21/76832* (2013.01); *H01L 23/53209* (2013.01); *H01L 23/53223* (2013.01); *H01L 23/53252* (2013.01)

(58) Field of Classification Search
CPC .......... H01L 23/5283; H01L 23/53238; H01L 23/53266; H01L 21/76831; H01L 21/76834; H01L 21/76883; H01L 21/76843; H01L 21/76849; H01L 21/768521; H01L 2224/4051; H01L 2224/4851; H01L 2221/1084
See application file for complete search history.

(56) References Cited

U.S. PATENT DOCUMENTS

| | | | |
|---|---|---|---|
| 5,011,580 A | 4/1991 | Pan et al. | |
| 5,236,551 A | 8/1993 | Pan | |
| 5,656,554 A | 8/1997 | Desai et al. | |
| 6,150,260 A | 11/2000 | Roy | |
| 6,340,601 B1 | 1/2002 | Curran, Jr. et al. | |
| 6,368,967 B1* | 4/2002 | Besser | H01L 21/7681 257/E21.577 |
| 6,982,227 B2 | 1/2006 | Cooney, III et al. | |
| 7,008,803 B2 | 3/2006 | Kane et al. | |
| 7,052,997 B2 | 5/2006 | Sandhu | |
| 9,190,285 B1 | 11/2015 | Abdallah et al. | |
| 9,343,361 B2* | 5/2016 | Lee | H01L 21/76898 |
| 2002/0180052 A1 | 12/2002 | Layadi et al. | |
| 2003/0080338 A1* | 5/2003 | Yamazaki | H01L 51/5215 257/59 |
| 2008/0211098 A1* | 9/2008 | Suzuki | H01L 21/2885 257/751 |

* cited by examiner

*Primary Examiner* — Zandra V Smith
*Assistant Examiner* — Abbigale A Boyle
(74) *Attorney, Agent, or Firm* — L. Jeffrey Kelly, Esq.; McGinn IP Law Gruop, PLLC

(57) ABSTRACT

A method of fabricating a metallization layer of a semiconductor device in which one or more interconnect structures are to be formed includes depositing a dielectric layer and forming a trench for each interconnect structure to be formed in the metallization layer. An insulating liner layer is deposited that serves both as a metal diffusion barrier and as a metal adhesion layer for the interconnect structures.

16 Claims, 4 Drawing Sheets

Post CMP

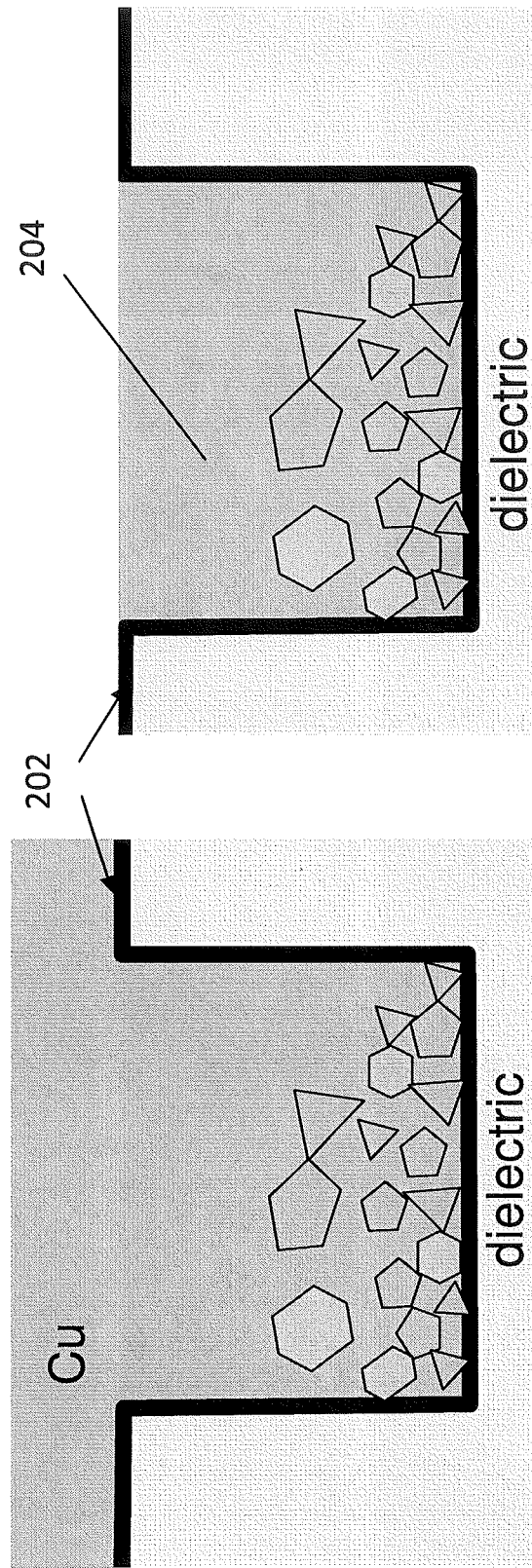

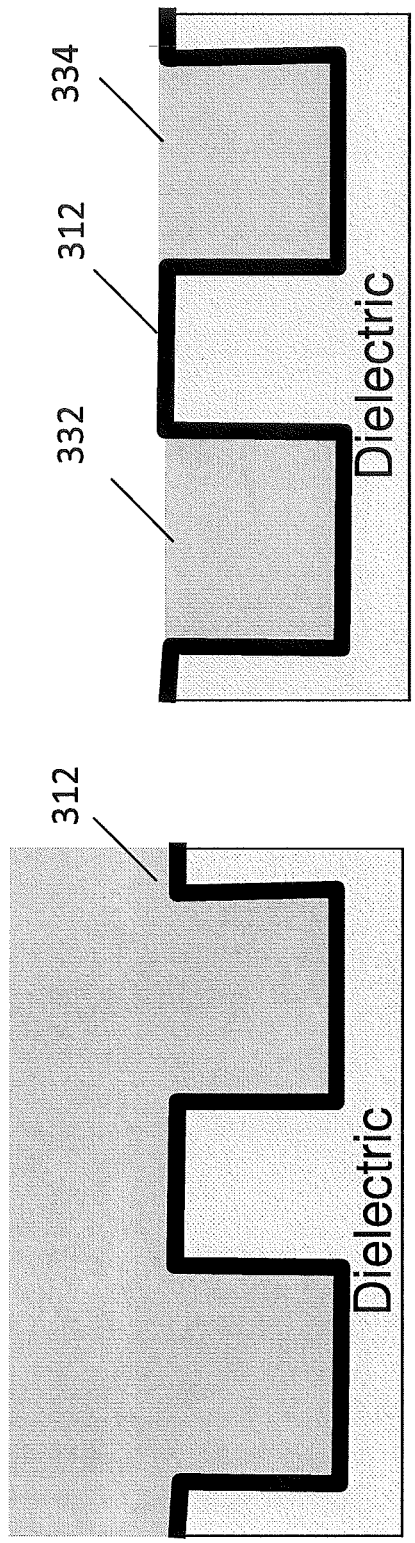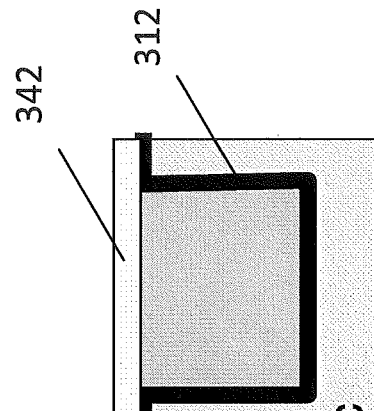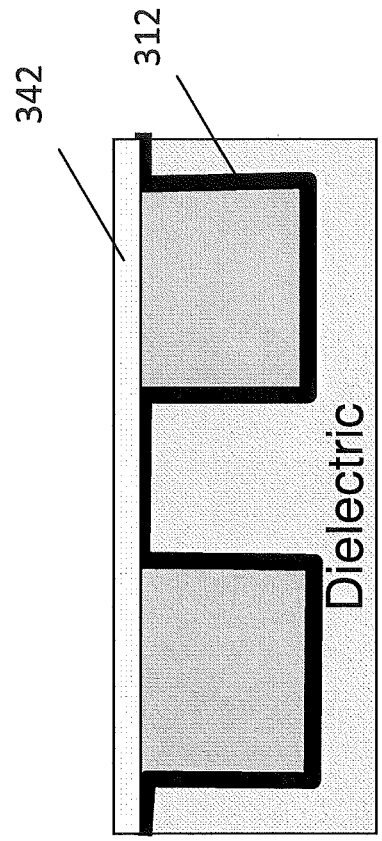

ADVANCED METAL INTERCONNECTS

BACKGROUND

The present invention relates to semiconductor fabrication and, more specifically, to providing a method to avoid over polish of the overburden removal step, thereby providing interconnects having lower electrical resistivity and better reliability.

As is well understood in the art, semiconductor chip fabrication traditionally includes a Front-End-Of-the-Line (FEOL) stage, followed by a Middle-Of-the-Line (MOL) stage and then a Back-End-Of-the-Line (BEOL) stage. Typical FEOL processes include wafer preparation, isolation, well formation, gate patterning, spacer, extension and source/drain implantation, silicide formation, and dual stress liner formation, which is basically the fabrication of electronic components in the wafer substrate. The MOL stage is mainly for gate contact formation, and BEOL is the stage in which the individual devices and components (transistors, capacitors, resistors, etc.) get interconnected with wiring on the wafer, which is to say that BEOL fabricates a plurality of metallization layers. A chip will typically have one layer of devices/components fabricated during FEOL but can have up to twelve or more metallization layers implemented in BEOL.

The present invention addresses a problem of semiconductor device fabrication related to the resistivity and reliability of the interconnect structures formed during BEOL processing.

FIG. 1A shows a post copper (Cu) plating and thermal annealing stage of one interconnect 102 of typically many interconnects in one metallization layer of typically several metallization layers formed in a conventional BEOL fabrication process. As shown, interconnect 102 has been filled in by a Cu deposition with the Cu overburden 104 still present. Metallic liner 106 not only prevents Cu migration into the underlying dielectric layer that envelopes interconnect 102 in this metallization layer but also provides better adhesion for the subsequently-deposited electrical conducting material (e.g., Cu), as compared to a common insulator. Metallic liner 106 is typically TaN, which is a conductive material. The area 114 in the metallization layer that surrounds the interconnect 102 is often referred to as the field area.

The overburden 104, typically between approximately 500 A to 1000 nm in thickness, is critical for promoting the grain growth into the patterned feature 102 during the post metal fill thermal anneal process. As shown in FIG. 1A, because of the mechanism by which grain growth occurs during the post metal fill and thermal annealing, larger grains 108 occur in the overburden area and top portion of the pattern feature 102, whereas smaller grains 112 remain in the bottom portion of the feature 102. FIG. 1B shows how the conventional BEOL fabrication step of chemical/mechanical polishing (CMP) will intentionally over polish in order to not only remove the Cu overburden 104 but also to ensure that the metallic liner 106 is removed from the field area 114.

Thus, the conventional polishing for chips with the conductive metallic liner 106 uses a two-step polishing technique. First, the Cu overburden 104 is removed, and this first stage stops when a polishing rate difference is detected by reason of polishing TaN in the metallic liner 106 in addition to the Cu in the overburden 104. The second step is a timed polishing that removes the conductive liner 106 from the field area, plus a certain amount of further intentional over polish, to ensure that no residual is left anywhere on the wafer, since such residual of TaN, previously noted to be conductive, would cause problems in subsequent fabrication steps and/or degrade or destroy features and/or functions of a chip.

The present invention notes that, in comparing the crystal structures in the cross sectional views of FIG. 1A and FIG. 1B, the conventional method of over polishing has left only the smaller Cu grains 112 in the interconnect structure 102. The larger Cu grains 108 that had been present in the upper portion of the interconnect structure 102 have been polished off during the second polishing stage, intended to ensure that the metallic liner 106 has been completely removed from the field area 114.

The present invention also recognizes that, due to contribution of resistivity increase from electron scattering at grain boundaries, the feature of having only these remaining small-grain Cu grains 112 at the bottom of the interconnect 102 is not so desirable since these remaining small grains 112 leave the interconnect structure 102 with a higher electrical resistivity than would result if at least some of the larger Cu grains 108 previously present in the upper portion could somehow be retained.

Finally, it is also noted that, although Cu is used as the metal fill in the exemplary discussion above, other metal fill material could be used, depending upon which specific technology is involved. Non-limiting examples of other metals that can be used in certain technical applications include any of cobalt (Co), ruthenium (Ru), tungsten (W), aluminum (Al), nickel (Ni), rhodium (Rh), and/or iridium (Ir). The techniques of the present invention apply equally to any of these other metal fill materials.

SUMMARY

The present invention recognizes that better interconnects could be formed during chip BEOL processing if it were possible to retain at least some of the larger Cu grains at the top of interconnect structures formed by the metal anneal step. Such feature of including larger Cu grains would provide interconnects with lower electrical resistivity and better interconnect reliability.

The solution of the present invention to address this unrecognized problem in conventional fabrication in which only smaller Cu grains remain after the post CMP stage is to provide a structure and method that reduces the over polishing that is characteristic of the conventional method.

To achieve this solution, the present invention removes the conductive metallic liner 106 shown in FIGS. 1A and 1B and adopts instead an insulator material(s) that does not have to be removed from the field area during the overburden removal polishing, thereby eliminating the reason for over polishing shown in FIG. 1B used in conventional fabrication methods.

Thus, a key feature of the present invention is that it restructures the conventional interconnect structure in a manner that eliminates the over polishing necessary in conventional fabrication methods, thereby retaining larger metal grains that were previously polished off in the second stage of the overburden removal polishing.

BRIEF DESCRIPTION OF THE DRAWINGS

FIG. 2A illustrates a cross section view 200 of an interconnect 204 in the post Cu plating stage in an exemplary embodiment of the present invention using insulating liner 202;

FIG. 2B illustrates a cross section view 210 of the interconnect 204 at the post CMP stage utilizing the present invention;

FIG. 3C illustrates a cross section view 320 of the metal fill deposition stage;

FIG. 3D illustrates a cross section view 330 of the planarization stage; and

FIG. 3E illustrates a cross section view 340 of the capping layer deposition stage.

DETAILED DESCRIPTION

FIG. 2A shows a first exemplary embodiment of the present invention in which insulating layer 202 is deposited before the Cu deposition. As shown in FIG. 2B, this insulation layer 202 replaces the conductive metallic liner 106 used in the conventional structure shown in FIG. 1A and FIG. 1B. This substitution of materials eliminates the need for the Cu over polish of the conventional fabrication shown in FIG. 1B. A key consequence of eliminating the over polish is that more large Cu grains 206 remain in the resultant interconnect structure 204, as is clear in comparing FIGS. 1B and 2B.

Figure 1B:
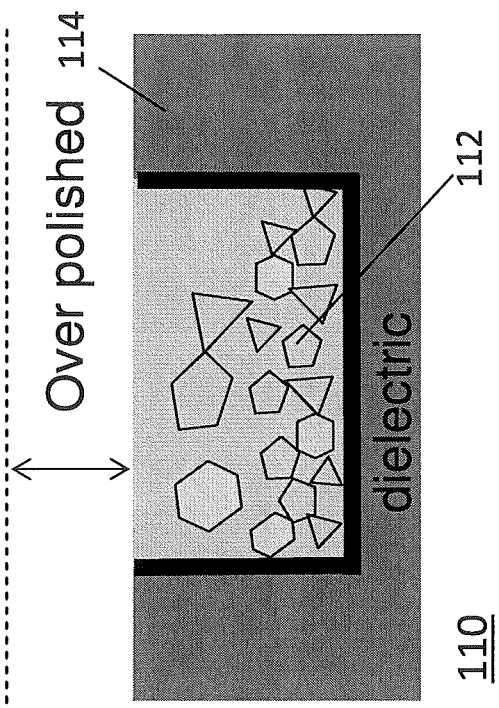
FIG. 1B illustrates a cross section view 110 of a conventional post CMP stage of the same metallization layer.
Figure 1A:
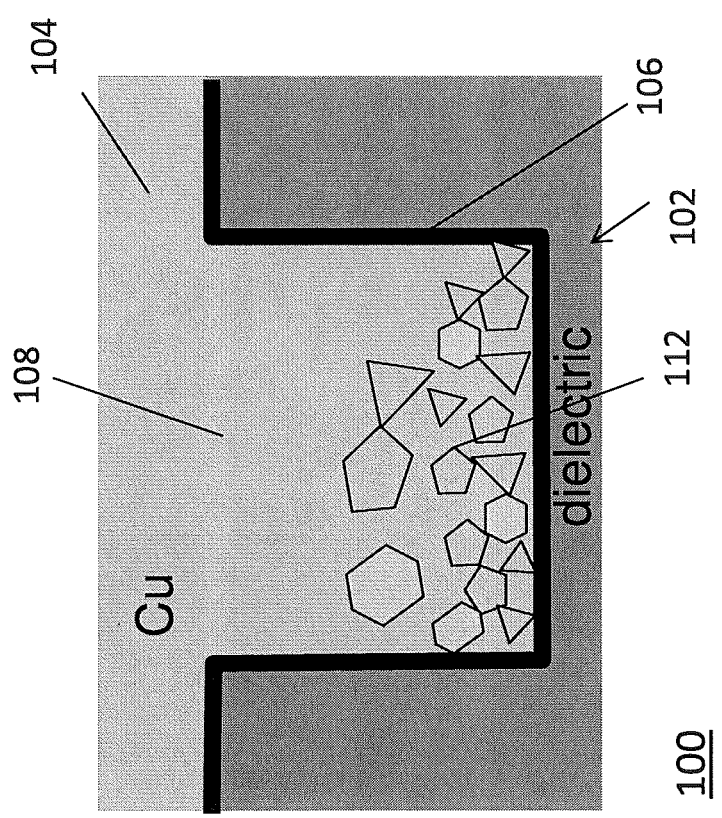
FIG. 1A illustrates a cross section view 100 of an interconnect 102 in a conventional post Cu plating and thermal annealing stage of the fabrication of a metallization layer.

Because of these larger grains 206, the resultant interconnect structure 204 has lower electrical resistivity and better interconnect reliability, even if the relative cross sectional areas of the interconnect structures of FIGS. 1B and 2B were to be equalized. That is, compared to a conventional interconnect structure containing only small grains, a reduction of electrical resistivity of the conductor is achieved by eliminating or decreasing the resistance contribution from the grain boundary scattering. For the same physical volume, a structure containing larger grains results in fewer grain boundaries, and, indeed, no grain boundary exists in a single crystal conductor. Additionally, by reducing the number of grain boundaries within a conductor (or, equivalently, by increasing the size of grains for equivalent volume), reliability degradation due to electromigration is improved compared to the conventional structure.

FIG. 3A-3E shows fabrication steps for implementing the first exemplary embodiment shown in FIGS. 2A & 2B. In initial step 300 shown in FIG. 3A, trenches 302, 304 have been etched in the underlying dielectric layer 306. This etching step is a conventional post patterning stage well known in BEOL technology. Depending on which chip fabrication technology is being used, the dielectric material 306 can be any of silicon oxide, nitride, carbide, or low-k dielectrics, and the layer shown in FIG. 3A could be any of the multiple interconnect layers of a typical BEOL processing. The dimensions of the trenches 302, 304 and the dielectric layer 306 are dependent upon specific technology and not critical to the present invention.

Figure 3B:
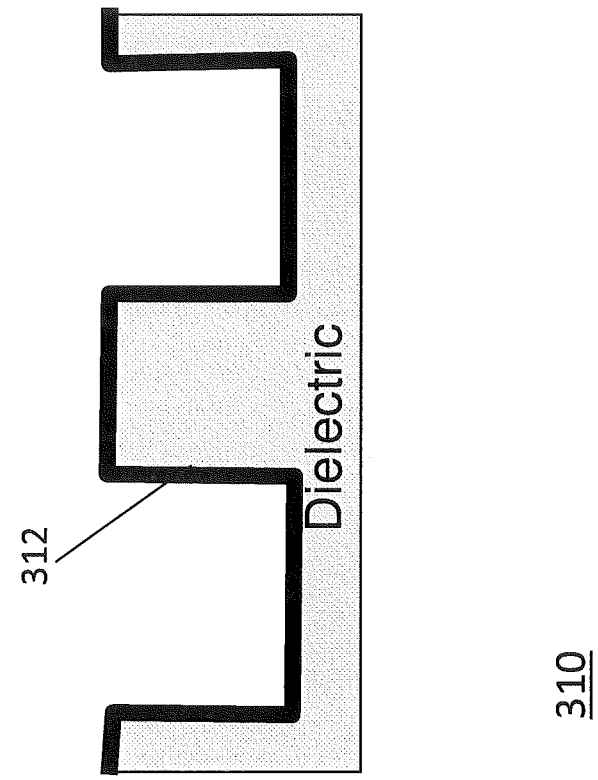
FIG. 3B illustrates a cross section view 310 of the insulator liner deposition stage.
Figure 3A:
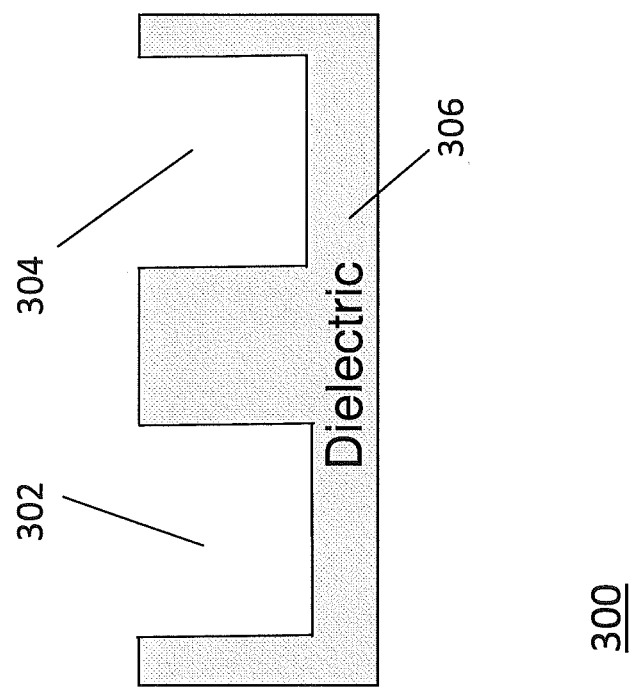
FIG. 3A illustrates a cross section view 300 of an initial fabrication stage showing trenches 302, 304 etched in the dielectric layer of a metallization layer.

FIG. 3B shows the deposition of the insulator liner 312 of the exemplary first embodiment. Any appropriate deposition mechanism can be used, including, for example, physical vapor deposition (PVD), atomic layer deposition (ALD), chemical vapor deposition (CVP), electroless deposition, or any combination of these methods. In a preferred exemplary embodiment, the insulator liner 312 will have a thickness of approximately 2 A to 500 A, preferably between approximately 5 A to 200 A. In one exemplary embodiment, the insulating liner 312 comprises $Ta_3N_5$, known to be a good insulator material. Other materials for the insulating liner 312 could be any of M(N,O), where M is any of Ta, Ti, Al, Mn, Ni, W, Hf, Mg, Cr, Ga, V, Co, Cu. Non-limiting examples include any of: TaNO, TiNO, AlNO, MnNO, NiNO, WNO, HfNO, MgNO, CrNO, GaNO, VNO, CoNO, CuNO. In another embodiment of the current application, the insulating liner 312 could be/contains SiN, SiO, SiC, Si(N,O,H,C). In yet, In another embodiment of the current application, the insulating liner 312 could be/contains any combination of the M(N,O) and SiN, SiO, SiC, Si(N,O,H, C), or any combination of these exemplary insulator materials, as well as other insulator materials. The insulator liner layer 312 of the present invention performs the same functions as those of the metallic liner layer 106 of the conventional interconnect structure 102 shown in FIG. 1A and FIG. 1B but achieves these functions as an insulator that does not present the same concerns that cause the conventional over polish shown in FIG. 1B.

FIG. 3C shows the metal fill stage 320, in which a metal 322 such as Cu is deposited to form the interconnect structures and the overburden. Other possible fill metals include, for example, aluminum (Al), tungsten (W), cobalt (Co), Ruthenium (Ru), Iridium (Ir), Rhodium (Rh), or nickel (Ni), or any combination of these exemplary fill metals.

FIG. 3D shows the planarization stage 330 in which the overburden has been removed down to the level of the upper surface of the insulating liner layer 312, leaving interconnect structures 332, 334. Depending upon which specific fabrication technique and metal fill material is used, the planarization processing can be done by chemical/mechanical polish (CMP), or mechanical-only polish, or chemical-only polish.

The present invention is distinguished from the conventional planarization processing shown in FIG. 1B in that the process is stopped upon reaching the insulating liner 312, which is possible in the present invention because the insulating liner 312 does not present the same concerns as the metallic liner 106 used in the conventional BEOL procedure. A benefit of this technique of stopping at a level that over polishing is eliminated is that larger grains remain at the top of the resultant interconnects 332, 334.

FIG. 3E shows a capping layer deposition stage 340 in which a capping layer 342 is deposited on top, in preparation for building a next BEOL level of the device, possibly another metallization layer of the BEOL processing. Non-limiting examples of possible capping layer material could be any of SiC, SiN, Si(H,C), or any combination thereof. It is noted that this capping layer is optional since, in some technologies, a subsequent metallization layer or other BEOL layer could be implemented without using a capping layer.

Although the discussion above has described several different exemplary embodiments, one having ordinary skill would readily recognize that other exemplary embodiments are possible based on the description above. For example, the insulating liner 202 shown in FIGS. 2A and 2B can be a single layer, a bi-layer, or a multiple layers. In the case of bi-layer of multiple layers, the insulating liner 202 can contain both M (N,O), where M is any of Ta, Ti, Al, Mn, Ni, W, Hf, Mg, Cr, Ga, V, Co, Cu, and a common insulator like Si3N4, SiO2, SiC, SiC(N,H).

In view of the explanations above, the present invention can be viewed as providing a replacement material for the conductive metallic liner 106 that was causing the over polishing of the conventional BEOL processing, since the insulator layer, M(N,O) and/or common insulators, does not need to be removed out by over polishing.

The present invention provides various benefits. As mentioned, by providing interconnect structures with larger metal grains at the top, the interconnects have lower resistance and higher reliability. Another benefit is that the present invention is fully compatible with current BEOL process flow.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    in a fabrication stage of a metallization layer of a semiconductor device in which one or more interconnect structures are to be formed, initially depositing a dielectric layer as a basis for said metallization layer;
    forming a trench in said dielectric layer for each interconnect structure to be formed in said metallization layer; and
    depositing an insulating liner layer that serves both as a metal diffusion barrier and as a metal adhesion layer for said interconnect structures,
    wherein said insulating liner layer comprises one of $Ta_3N_5$ and M(N,O), where M is any of Ta, Ti, Mn, Ni, W, Hf, Mg, Cr, Ga, V, Co, and Cu.

2. The method of claim 1, wherein said insulating liner layer comprises any of: $Ta_3N_5$, TaNO, TiNO, MnNO, NiNO, and WNO.

3. The method of claim 1, wherein said insulating liner layer comprises a plurality of layers.

4. The method of claim 1, further comprising:
    depositing a metal to fill the trenches formed in said dielectric layer and to form an overburden layer;
    performing a heat anneal procedure for said deposited metal; and
    polishing to remove said annealed metal in said overburden layer, said polishing to stop at a level of approximately a top surface said insulating liner layer.

5. The method of claim 4, wherein a size of metal grains at a top portion of said interconnect structures is larger than a size of metal grains at a bottom portion of said interconnect structures.

6. The method of claim 4, wherein said polishing is terminated upon detecting that said polishing has removed sufficient overburden metal material so that interconnect structures formed in two different trenches are electrically disconnected.

7. The method of claim 4, wherein said metal fill comprises copper (Cu).

8. The method of claim 4, wherein said metal fill comprises any of: copper (Cu), cobalt (Co), ruthenium (Ru), tungsten (W), aluminum (Al), nickel (Ni), rhodium (Rh), and iridium (Ir).

9. The method of claim 4, further comprising depositing a second insulating liner layer on top of the polished annealed metal, the second insulating liner layer thereby causing a continuous insulating liner to surround each said interconnect structure in said metallization layer, as well as forming a continuous insulating liner layer over a field area around each said interconnect structure.

10. A semiconductor chip, as fabricated using the method of claim 1.

11. A semiconductor device comprising a semiconductor chip of claim 10.

12. A semiconductor device, comprising:
    a substrate having a plurality of electronic component elements fabricated on a top surface thereof, in a device layer; and
    a plurality of metallization layers formed successively on top of said device layer, to interconnect said electronic component elements, each said metallization layer having a different interconnect pattern,
    wherein at least one metallization layer includes one or more interconnect structures formed in a dielectric layer, and at least one said interconnect structures comprises:
    a fill metal; and
    an insulating liner layer that surrounds said fill metal on sides and bottom in a cross-sectional view and that serves both as a metal diffusion barrier and as a metal adhesion layer for said interconnect structure,
    wherein a size of metal grains at a top portion of said interconnect structure in said cross sectional view is larger than a size of metal grains at a bottom portion of said interconnect structure, and
    wherein said insulating liner layer comprises one of $Ta_3N_5$ and M(N,O), where M is any of Ta, Ti, Mn, Ni, W, Hf, Mg, Cr, Ga, V, Co, and Cu.

13. The semiconductor device of claim 12, wherein said insulating liner layer comprises any of: $Ta_3N_5$, TaNO, TiNO, MnNO, NiNO, and WNO.

14. The semiconductor device of claim 12, wherein said metal fill comprises any of: copper (Cu), cobalt (Co), ruthenium (Ru), tungsten (W), aluminum (Al), nickel (Ni), rhodium (Rh), and iridium (Ir).

15. The method of claim 4, wherein the depositing of the insulating liner layer comprises depositing the insulating liner layer in the trench and on the dielectric layer outside the trench, and
    wherein the method further comprises:
        forming a capping layer on the metal in the trenches and on the insulating liner layer outside the trenches.

16. The method of claim 1, wherein a thickness of the insulating liner layer is in a range from 2 Å to 500 Å.

* * * * *